US007474036B2

(12) United States Patent
Tsujino

(10) Patent No.: US 7,474,036 B2
(45) Date of Patent: Jan. 6, 2009

(54) HIGH-CAPACITY ULTRASONIC COMPOSITE OSCILLATING DEVICE

(75) Inventor: Jiromaru Tsujino, 117-143 Katakura cho, Kanagawa-ku, Yokohama-shi, Kanagawa 221-0861 (JP)

(73) Assignees: Jiromaru Tsujino, Kanagawa (JP); Asahi E.M.S. Co., Ltd., Tokyo (JP)

( * ) Notice: Subject to any disclaimer, the term of this patent is extended or adjusted under 35 U.S.C. 154(b) by 52 days.

(21) Appl. No.: 10/573,503

(22) PCT Filed: Sep. 29, 2003

(86) PCT No.: PCT/JP03/12414

§ 371 (c)(1), (2), (4) Date: Nov. 22, 2006

(87) PCT Pub. No.: WO2005/030403

PCT Pub. Date: Apr. 7, 2005

(65) Prior Publication Data

US 2007/0075607 A1 Apr. 5, 2007

(51) Int. Cl.
*H02N 2/00* (2006.01)
*H01L 41/09* (2006.01)

(52) U.S. Cl. ............. 310/317; 310/323.12; 310/323.13; 310/325

(58) Field of Classification Search ............ 310/323.01, 310/323.02, 323.12, 323.13, 323.14, 317, 310/325, 328

See application file for complete search history.

(56) References Cited

U.S. PATENT DOCUMENTS 3,657,910 A 4/1972 Isobe et al.
3,696,259 A * 10/1972 Mori et al. ............. 310/323.01
4,622,483 A * 11/1986 Staufenberg et al. ......... 310/328
5,144,187 A * 9/1992 Culp .......................... 310/328
5,182,484 A * 1/1993 Culp .......................... 310/328
5,389,849 A 2/1995 Asano et al.
6,147,436 A * 11/2000 Claeyssen et al. ....... 310/323.02
6,995,498 B2 * 2/2006 Wallaschek et al. .... 310/323.18
7,196,453 B2 * 3/2007 Izenson et al. ......... 310/316.01

FOREIGN PATENT DOCUMENTS

EP 0 590 373 4/1994
JP 49-112582 10/1974

(Continued)

*Primary Examiner*—Thomas M Dougherty
(74) *Attorney, Agent, or Firm*—Duane Morris LLP

(57) ABSTRACT

The invention is intended to provide a high-capacity ultrasonic composite oscillating device that is sufficiently rigid as a composite oscillating body for various strong ultrasonic applications. One constructed such that BLTs (1, 1', 2, 2', . . . n, n') of the same characteristics are disposed around an outer peripheral portion of a disk-shaped oscillating body 4 in n-sets opposed to each other and disposed at regular intervals, opposed BLTs being driven in an opposite phase mode, and driven in an oscillating mode in which the phase between the BLTs in adjacent sets is shifted by π/n, and an oscillating rod connected to a center of the disk-shaped oscillating body is induced with a composite oscillation output of oscillation capacity n-times that of one set of BLTs induced in the center of the disk-shaped oscillating body 4, and one in which a plurality of these oscillating devices are jointed together to increase the oscillation capacity.

13 Claims, 3 Drawing Sheets

FOREIGN PATENT DOCUMENTS

| | | |
|---|---|---|
| JP | 05-52598 | 5/1976 |
| JP | 05-064465 | 3/1993 |
| JP | 05-316756 | 11/1993 |
| JP | 06-153546 | 5/1994 |
| JP | 11-087437 | 3/1999 |
| JP | 2001-179179 | 7/2001 |

* cited by examiner

HIGH-CAPACITY ULTRASONIC COMPOSITE OSCILLATING DEVICE

TECHNICAL FIELD

The present invention relates to a high-capacity ultrasonic composite oscillating device used in an ultrasonic processing machine or a shifter for processing (joining, cutting, grinding, deforming, and so on) metal, plastic, ceramics, electronic component and the like with oscillations.

BACKGROUND ART

In conventional, an ultrasonic composite oscillating device disclosed in JP-A-11-87437 is known in the related art.

The related art is composed in such a manner that a composite flexure oscillating body is induced by two driving vertical transducers which are orthogonal to each other.

However, in the related art, since excitation of a flexure oscillating rod is achieved by the two driving vertical transducers, it is impossible to provide a high-capacity (large output) vibration energy, and hence the range of application is limited as a wire bonder within 0.7 mm in wire diameter.

Therefore, a high-capacity ultrasonic composite oscillating device has been much needed for ultrasonic processing such as spot joining, seam welding, plastic joining, or metal deformation of metal plate other than wires.

It is an object of the present invention is to provide a high-capacity ultrasonic composite oscillating device by installing a plurality of sets of ultrasonic transducers to a disk-shaped oscillating body is formed of a material with high rigidity so that vibration loss is negligible.

DISCLOSURE OF INVENTION

In order to solve the problem described above, the present invention is achieved by the inventors who have found a fact that a center portion of a disk-shaped oscillating body induces composite oscillations that follow a Lissajous track by installing a plurality of sets of ultrasonic transducers, which are driven in opposite phases when being opposed to each other, at regular interval on an outer peripheral portion of the disk-shaped oscillating body.

The invention according to Claim 1 is a high-capacity ultrasonic composite oscillating device includes n-sets (n≧2) of bolt-tightened Langevin-type ultrasonic transducers (hereinafter, abbreviated as BLT) having the identical characteristics disposed at regular intervals on an outer periphery portion of a disk-shaped oscillating body so as to oppose to each other, the disk-shaped oscillating body having a center portion which serves as an oscillation loop, wherein the BLTs are driven in such a manner that the opposed BLTs are driven in a opposite-phase mode respectively, and the adjacent sets of BLTs are driven in a oscillating mode in which the phase is shifted by π/n, so that composite oscillations occur at the center portion of the disk-shaped oscillating body.

The invention according to claim 2 is, in addition to the invention according to claim 1, a loop segment of oscillation of an oscillating rod that oscillates in a composite flexure oscillating mode is connected to the center portion of the disk-shaped oscillating body.

When a first pair of BLTs are oscillated vertically in opposite phases, the disk-shaped oscillating body mechanically connected to the BLTs are induced in the direction of diameter that connects axial centers of the both BLTs. A second pair of BLTs located next to the first pair are induced π/n phase behind the first pair of BLTs, and a third pair of BLTs located next to the second pair are induced π/n phase behind the second pair of BLTs, and in the same manner, the BLTs are induced to a $n^{th}$ pair.

The disk-shaped oscillating body is induced by the n pairs of BLTs, and the center potion thereof induces composite oscillations that follow the Lissajous track, and an oscillation output is 2n times capacity of the single BLT. By connecting the loop segment of oscillation of the oscillating rod that oscillates in the composite flexure oscillating mode to the center of the disk-shaped oscillating body, a high-capacity composite oscillation output of 2n times the single BLT can be obtained from an end of the oscillating rod.

Therefore, by mounting a tool or a slider for ultrasonic composite oscillation processing according to the object at the end of the oscillating rod, a high-capacity ultrasonic composite oscillation processing machine or a shifter can be provided.

BEST MODE FOR CARRYING OUT THE INVENTION

Figure 1:
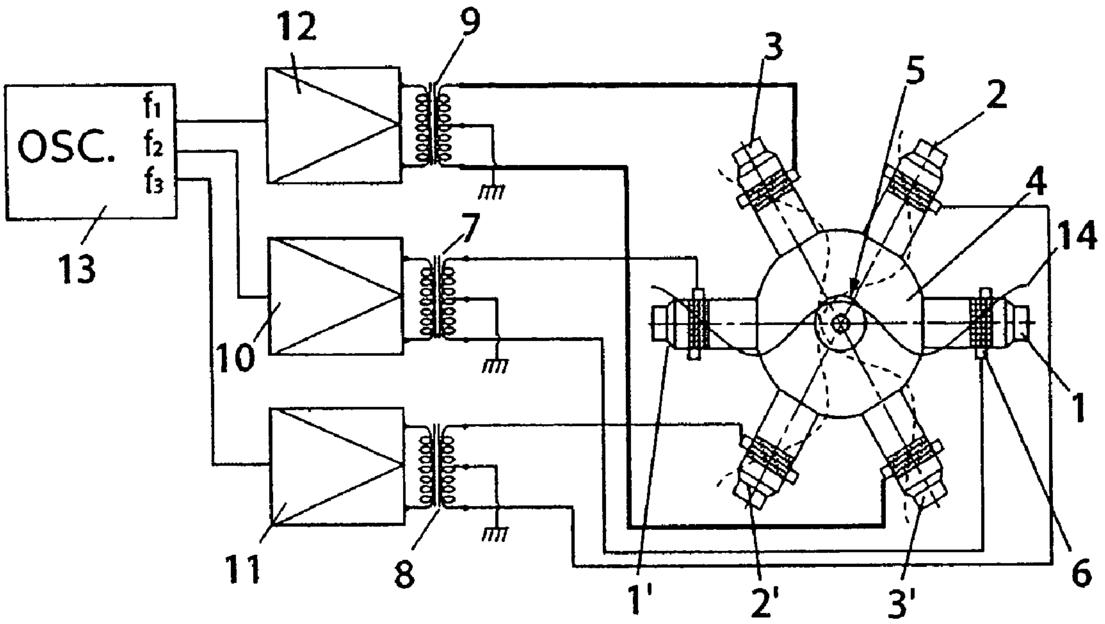
FIG. 1 is a block diagram showing a principle of a high-capacity ultrasonic composite oscillating device according to the present invention.
Figure 2:
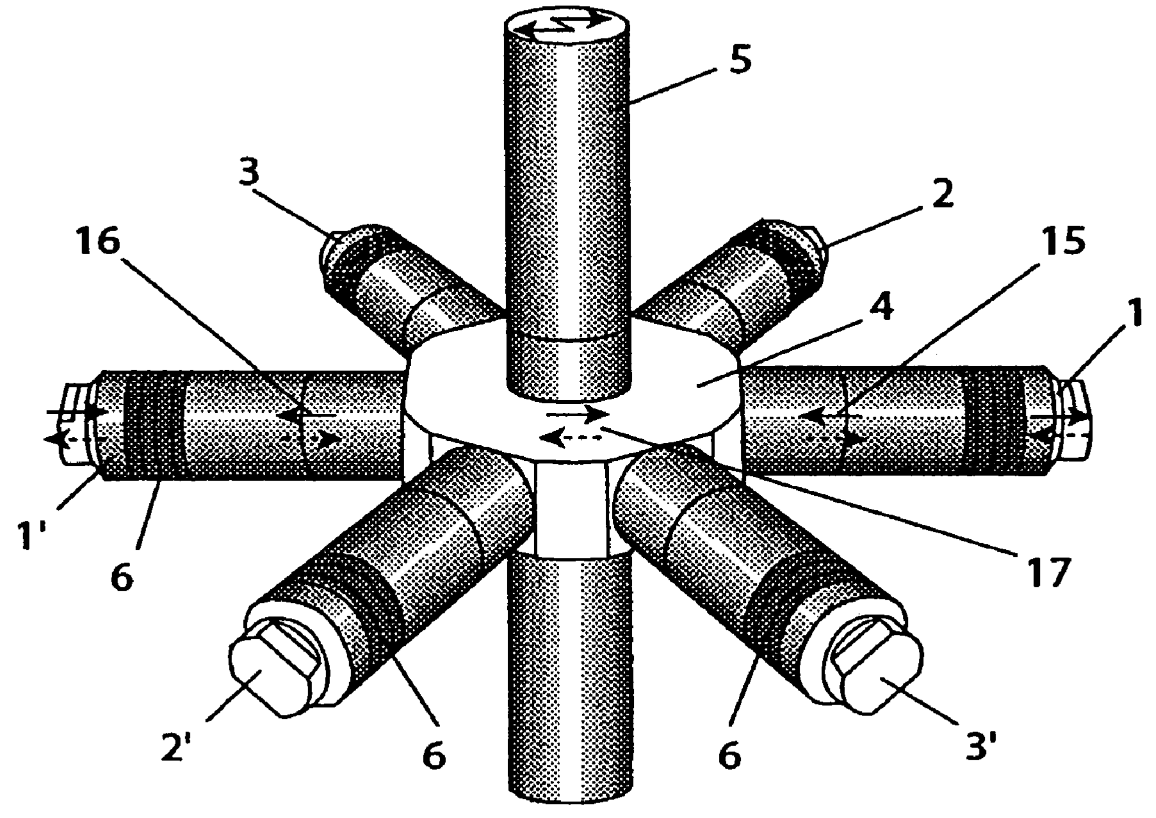
FIG. 2 is an appearance view of a configuration of an oscillating system.

As shown in FIG. 1, three sets (n=3) of BLTs 1, 1', 2, 2' and 3, 3' are arranged at regular intervals on an outer peripheral portion of a disk-shaped oscillating member 4. As shown in FIG. 2, an oscillating rod 5 that is induced in a composite flexure oscillating mode is connected to a center portion of the disk so as to be perpendicular to the disk-shaped oscillating body. Since each portions in an oscillating system, shown in FIG. 2, are all connected with center bolts (not shown), a structure in high rigidity is achieved.

Each BLT is formed into a bolt-tightened Langevin structure in which an electrostrictive element 6 supported by metal blocks from both sides. The six BLTs used here have the same vibration characteristics.

A pair of opposing BLTs 1, 1' are connected to an oscillator 13, an electric power amplifier with a phase shifter 10 and an output transformer 7, and electric signals of opposite phase from each other are applied by the action of the output transformer 7. Therefore, when the BLT 1 is in a resilient oscillating mode 15 in which the BLT 1 is expanded by the electric signal, the BLT 1' is in a resilient oscillating mode 16 in which the BLT is contracted. In this case, the center of the disk-shaped oscillating body 4 is displaced from the BLT 1 toward the BLT 1'. An oscillating mode of the BLT1 → the disk-shaped oscillating body 4→BLT 1' is as indicated by reference numeral 14, and the oscillating mode of a center of a joint portion between the disk-shaped oscillating body and the oscillating rod is an oscillating mode 17 in the direction of the axial center of the BLTs 1, 1'.

The BLTs 2, 2' are driven π/3 phase behind the driving of the BLTs 1, 1' by an electric power amplifier with a phase shifter 11 and an output transformer 8, and the BLTs 3, 3' are driven further π/3 phase behind with an electric power amplifier with a phase shifter 12 and an output transformer 9.

The center portion of the disk-shaped oscillating body 4 induces composite oscillations which follow a Lissajous track by a vector sum of oscillations of three sets of BLTs.

Figure 3:
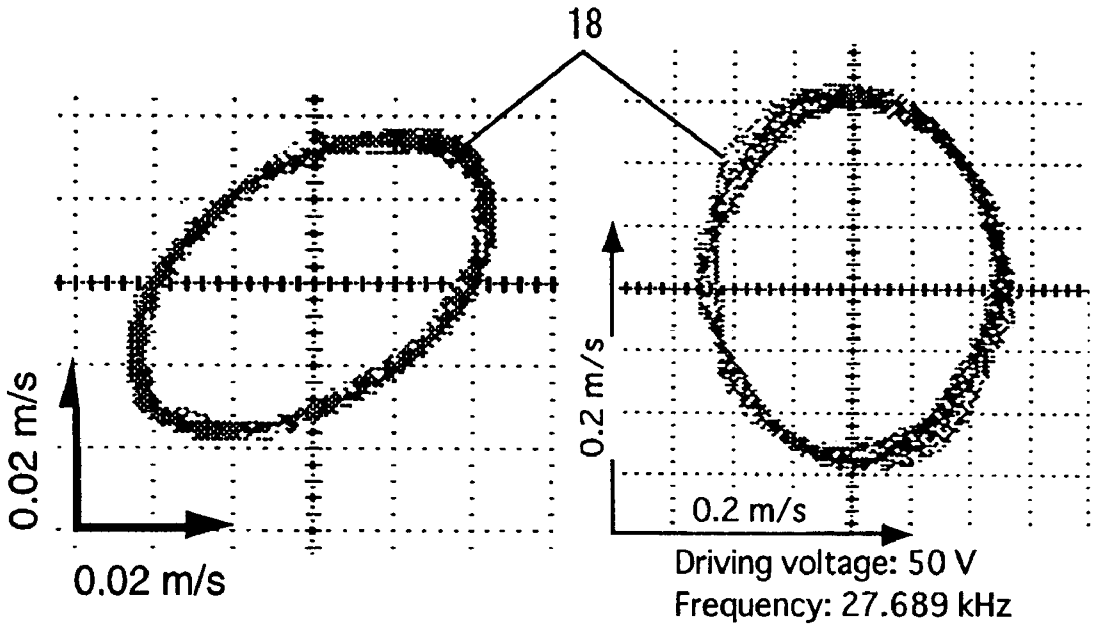
FIG. 3 is a measured drawing showing an oscillating mode of a center of the end of an oscillating rod.

Therefore, the oscillating rod 5 is induced by the composite oscillations induced by the disk-shaped oscillating body 4, and the oscillating mode at the end thereof is an oval oscillation as shown in FIG. 3. The oval oscillation track is caused by a slight difference in drive voltage and resonance frequency among the respective BLTs, which can be corrected into a circular shape by adjusting the drive voltages and the drive phases of the electric power amplifiers with a phase shifter.

In FIG. 1, assuming that the material of the disk-shaped oscillating body 4 is iron and steel S45C (126 mm in diameter, 40 mm in thickness), the vertical resonance frequencies of the respective BLTs are 27 kHz (40 mm in diameter), the material of the oscillating rod 5 is iron and steel S45C (40 mm in diameter, 366 mm in length) and the drive voltages of the respective BLTs are 150 Vrms, the composite oscillating displacement amplitude at the end of the oscillating rod 5 was 4.5 μm.

The operation in the present embodiment is as follows.

Signals from the oscillator 13 which is synchronized with the resonance frequency of the BLTs are shifted in phase by π/n in sequence by the electric power amplifiers with a phase shifter 10, 11, 12 and the output signals are applied to the output transformers 7, 8, 9. These signals are applied to the respective sets of BLTs in the form of two signals of in opposite phase modes by the transformers with an intermediate tap 7, 8, 9.

The BLT converts the electric signal into a mechanical resilient oscillation, and drives the disk-shaped oscillating body 4. The center of the disk-shaped oscillating body forms a loop segment of oscillation and induces composite oscillations, and an oscillation output thereof is 6 times that of the single BLT.

The oscillating rod 5 connected to the center of the disk-shaped oscillating body 4 is induced by the composite oscillations of the center of the disk-shaped oscillating body, and the end thereof generates composite oscillations whose output is 6 times that of the single BLT, whereby a high-capacity ultrasonic composite oscillating device is realized.

Although the embodiment of the present invention has been described referring to the drawings, the detailed configuration of the present invention is not limited to the present embodiment, and modifications in design without departing from the scope of the present invention is also included in the present invention. For example, the oscillation amplitude can be set as desired by changing the thickness of a vertical oscillating node of the disk-shaped oscillating body, or by changing the diameter of a node surface of the oscillating rod (shouldered oscillating body, and so on).

The positions of installation of the respective BLTs do not have to be necessarily the regular intervals, and the positions of installation can be changed as needed.

Although the transformers with an intermediate tap are used for the pair of BLTs that are driven in the opposite phase modes in the embodiment, the electric signals may be applied in the same phase if the directions of polarization of the electrostrictive elements that constitute the BLTs are set to the directions opposite from each other, so that the transformers with an intermediate tap are not necessary.

Furthermore, by connecting M-pieces of the disk-shaped oscillating bodies each having a number of BLT transducers disposed on the outer peripheral portions thereof in series with oscillating rods while synchronizing oscillation phases and driving the BLT transducers of the respective disk-shaped oscillating bodies in parallel, an M-times high-capacity ultrasonic composite oscillating device is achieved.

Alternatively, by changing the drive phases of the respective opposed sets to drive the center of the disk-shaped oscillating body as the oscillation loop and the oscillating node, the oscillating rod disposed at the center portion of the disk can be driven in flexure oscillations and vertical oscillations, whereby two-dimensional and three-dimensional composite oscillations at the end portion of the oscillating rod are achieved.

Also, by installing a number of BLTs on the composite oscillating rod while considering the oscillation phases, a high-capacity composite oscillation source can be configured.

These ultrasonic composite oscillation sources may be configured into a feedback oscillator of a resonance-frequency automatic tracking type, and may be configured to control the oscillation amplitude and the oscillation output constant by employing an output of an oscillation detector disposed at an adequate position on the oscillating body or by detecting and employing a motional admittance of the oscillation source.

The drive frequencies of the respective sets of BLTs do not have to be necessarily the same, and the same effects may be achieved for the object such as bonding even when an envelop curve is not an oval or a circle, but is a composite oscillation track of square or rectangular shape.

INDUSTRIAL APPLICABILITY

As described thus far, according to the present invention, the high-capacity ultrasonic composite oscillating device with the oscillating body with high rigidity can be obtained.

The invention claimed is:

1. A high capacity composite oscillating device comprising:

a disk-shaped oscillating body having a center which serves as an oscillation loop;

n sets of bolt-tightened Langevin-type ultrasonic transducers (BLTs) having the identical vibration characteristics disposed at regular intervals on an outer periphery portion of said disk-shaped oscillating body so as to oppose each other, and;

n phase shifters for shifting the phase of an input to said n sets of BLTs by π/n;

wherein n is a positive integer greater than or equal to two, and;

wherein said BLTs are driven in such a manner that said opposed BLTs are driven in an opposite-phase mode respectively, and said adjacent sets of BLTs are driven in an oscillating mode in which the phase is shifted by π/n, so that composite oscillations occur at the center portion of said disk-shaped oscillating body.

2. The device of claim 1 further comprising an oscillating rod wherein a loop segment of oscillation of said oscillating rod that oscillates in a composite flexure oscillating mode is connected to said center portion of said disk-shaped oscillating body.

3. A high capacity ultrasonic composite oscillating device comprising:

an oscillating rod connected in series with one or more disk-shaped oscillating bodies, each one of said disk-shaped oscillating bodies further comprising:

a center which serves as an oscillation loop, and;

n sets of bolt-tightened Langevin-type ultrasonic transducers (BLTs) having the identical vibration characteristics disposed at regular intervals on an outer periphery portion of said disk-shaped oscillating body so as to oppose each other;

one or more of n phase shifters, each one of said phase shifters for shifting an oscillating phase of a set of said n sets of BLTs of each one of said one or more disk-shaped oscillating bodies by $\pi/n$;

wherein n is a positive integer greater than or equal to two, and;

wherein a respective set of BLTs of each of said n sets of BLTs disposed on each one of said one or more disk-shaped oscillating bodies are driven in parallel or independently, so that composite oscillations occur at an end of said oscillating rod.

4. The device of claim 1 further comprising n converters configured to receive and convert said phase shifted input into two phase shifted inputs of opposite polarity.

5. The device of claim 1 further comprising an oscillator configured to provide an input to said phase shifter.

6. The device of claim 1 wherein said composite oscillations follow a Lissajous track.

7. The device of claim 2 wherein said composite oscillations occur at an end of said oscillating rod.

8. The device of claim 7 wherein said composite oscillations are in a direction orthogonal to a center longitudinal axis of said oscillating rod.

9. The device of claim 8 wherein an oscillating mode at said end of said oscillating rod is an oval oscillation.

10. The device of claim 8 wherein an oscillating mode at said end of said oscillating rod is a circular oscillation.

11. The device of claim 3 wherein said oscillating rod oscillates in a composite flexure oscillating mode.

12. The device of claim 3 wherein a loop segment of oscillation of said oscillating rod is connected to each one of said center portions of said one or more disk-shaped oscillating bodies.

13. The device of claim 3 wherein said composite oscillations are in a direction orthogonal to a center longitudinal axis of said oscillating rod.

* * * * *